(12) United States Patent
Goetz et al.

(10) Patent No.: US 6,379,191 B1
(45) Date of Patent: Apr. 30, 2002

(54) CIRCULAR CONNECTOR SYSTEM

(75) Inventors: David Goetz; David Roth, both of Los Angeles, CA (US)

(73) Assignee: Next Planet, Inc.

( * ) Notice: Subject to any disclaimer, the term of this patent is extended or adjusted under 35 U.S.C. 154(b) by 0 days.

(21) Appl. No.: 09/653,481

(22) Filed: Sep. 1, 2000

(51) Int. Cl.⁷ .............................................. H01R 24/00
(52) U.S. Cl. ......................................... 439/660; 439/74
(58) Field of Search ................................. 439/660, 668, 439/669, 675, 677, 680, 613, 74

(56) References Cited

U.S. PATENT DOCUMENTS

| | | | | |
|---|---|---|---|---|
| 3,497,866 A | * | 2/1970 | Patton ........................ | 439/660 |
| 3,831,133 A | * | 8/1974 | Grundfest ................... | 439/660 |
| 3,868,162 A | * | 2/1975 | Ammon ...................... | 439/75 |
| 4,025,964 A | * | 5/1977 | Owen .......................... | 439/39 |

* cited by examiner

Primary Examiner—Tulsidas Patel
(74) Attorney, Agent, or Firm—George Gin-Chong Tseng

(57) ABSTRACT

An electrical connector having a connector housing with a first surface with a center portion, the first surface having a circular periphery. A set of contacts disposed around the center portion of the round connector housing and accessible through a set of openings in the first surface of the connector housing.

15 Claims, 9 Drawing Sheets

CIRCULAR CONNECTOR SYSTEM

FIELD OF THE INVENTION

This invention relates to the field of use of connectors. More particularly, the present invention relates to a circular connector system for electronic devices.

BACKGROUND

Currently, devices such as computer systems and peripherals, consumer electronic devices, and other electronic devices are connected to each other through the use of cables. In some cases, multiple cables are used to connect these devices, which can tangle and disconnect. Often, when devices are stacked on top of each other, long cables are extraneous and cause more clutter than is necessary.

An exemplary system that exists for eliminating or reducing the use of cables uses a rack-type of structure with pre-existing slots, shelves or grooves to hold a fixed number of devices, and a set of connectors on a backplane used to connect to each device as they are inserted. Each device has one or more connectors on a back plate of the device that connect to a corresponding number of connectors in the set of connectors on the backplane of the rack. The rack contains one input/output connector on the back of the rack that is connected to all the connectors on the backplane. One drawback to the rack system is that when the number of devices to be interconnected exceeds the number of slots in the rack, the system is expandable only by adding another rack or modifying the existing rack. Also, as the connection between the device and the rack is often hidden from the user's view as it is being made, misaligned connections are not readily apparent. Connections can also be faulty where devices are not fully inserted, leaving connectors between the devices and the rack only partially mated.

Thus, a connector system that solves one or more of the above problems is desirable.

BRIEF DESCRIPTION OF THE DRAWINGS

The system is illustrated by way of example and not limitation in the figures of the accompanying drawings in which like references indicated similar elements and in which.

DETAILED DESCRIPTION

The present invention is directed to a circular connector system. The circular connector system, in one embodiment, is used to provide electrical connection for transferring signals between two or more devices where the one device is stacked on top of another device.

Figure 2:
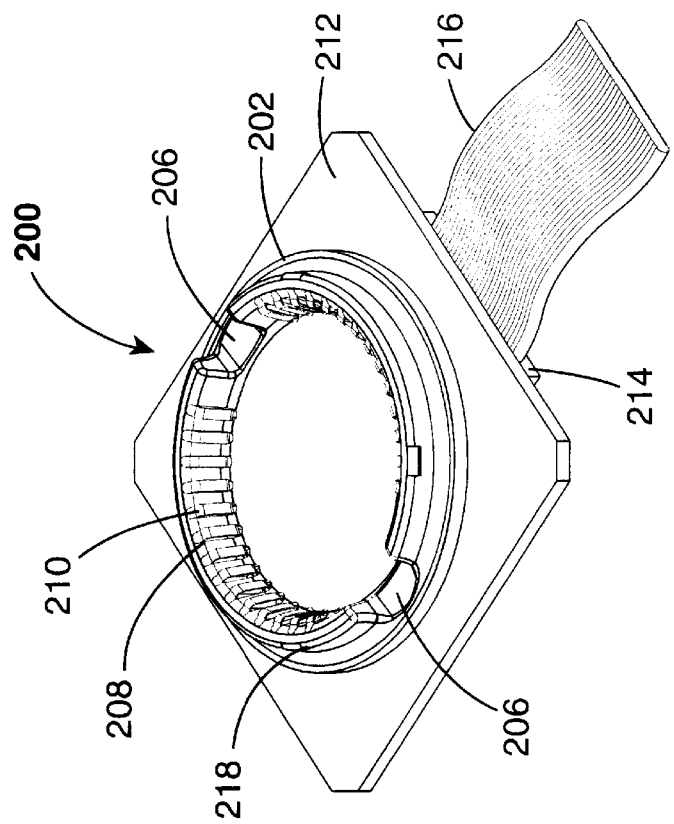
FIG. 2 is an isometric view of a receptacle connector in one embodiment of the present invention.
Figure 1:
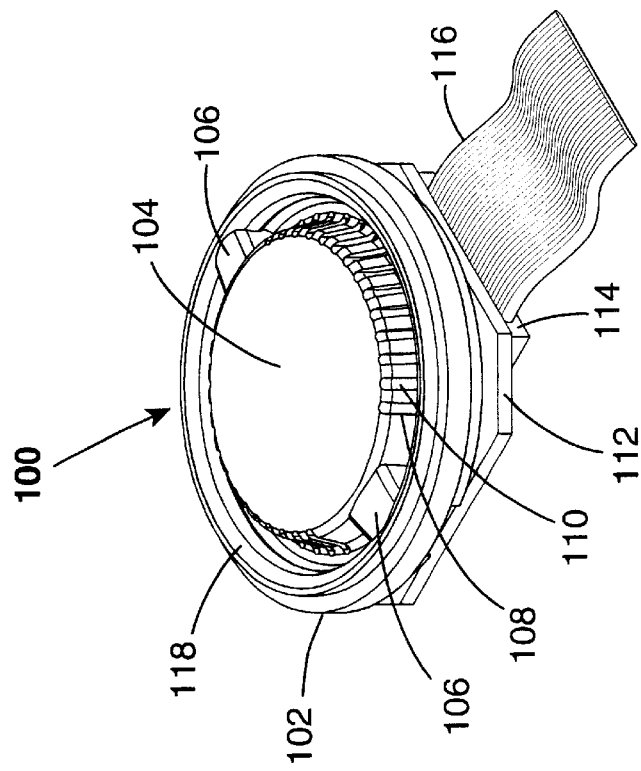
FIG. 1 is an isometric view of a plug connector in one embodiment of the present invention.

FIG. 1 is an isometric view of a plug connector 100, including a circular housing 102 configured to mate with a receptacle connector 200 as shown in FIG. 2. Housing 102 contains an integrated keying/alignment element 106 and a set of openings 108 displaced around a center portion 104. A set of contacts 110 is accessible through set of openings 108. In another embodiment, set of contacts 110 includes additional contacts accessible through a second set of openings displaced on an outer perimeter 118. In yet another embodiment, set of openings 108, instead of being displaced around center portion 104, is only displaced around outer perimeter 118.

Figure 3:
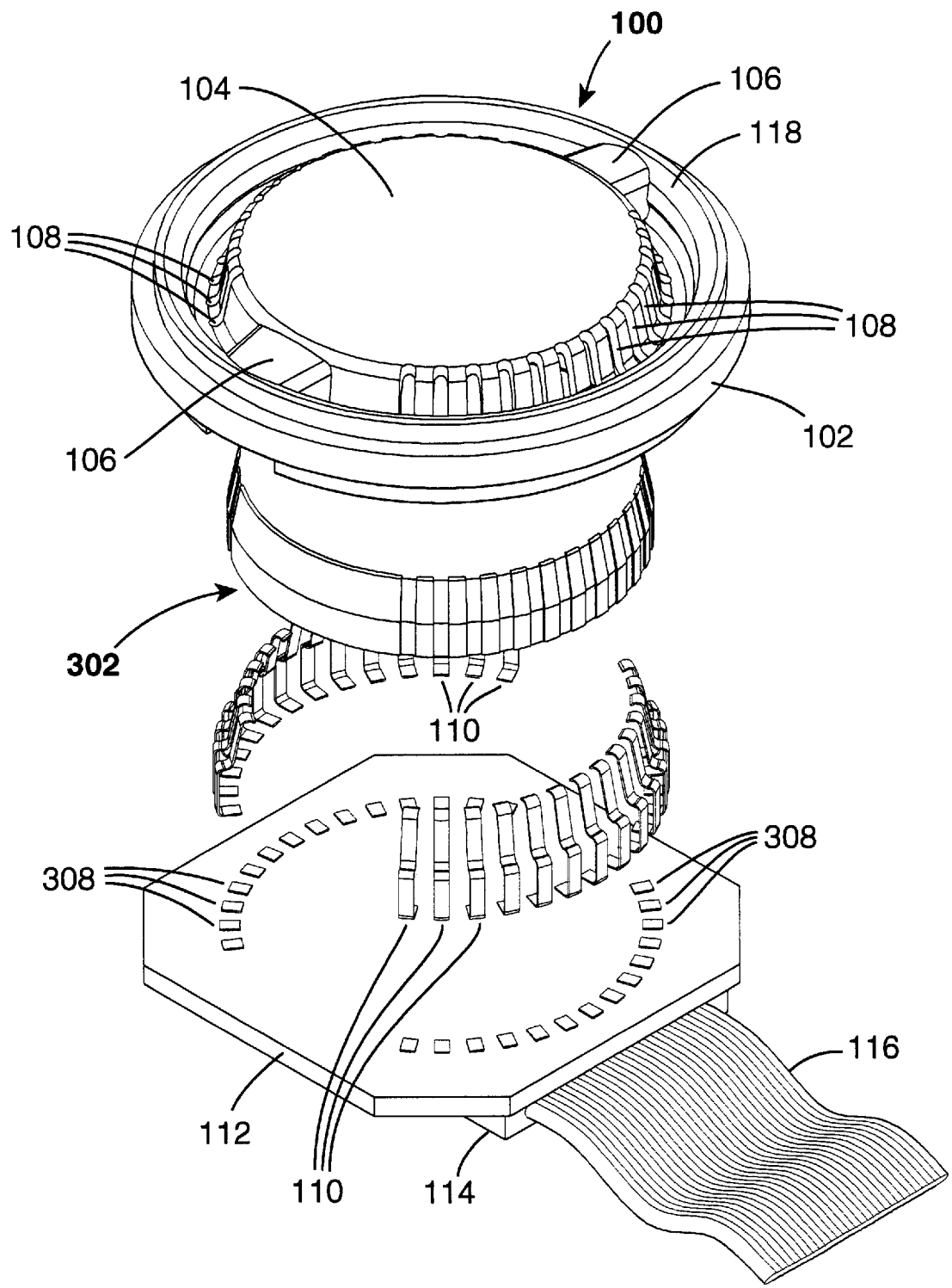
FIG. 3 is an exploded isometric view of the plug connector of FIG. 1.

FIG. 3 is an exploded isometric view of plug connector 100 of FIG. 1, where a contact support 302 is exposed. Contact support 302 is further described below in FIG. 4. Also visible in FIG. 3 is a set of circuit board contacts 308 on a circuit board 112. Set of contacts 110 is connected to set of circuit board contacts 308. Set of circuit board contacts 308 is connected to a plug 114 located on a second surface of circuit board 112 through a set of traces in circuit board 112 (not shown). Set of circuit board contacts 308 may also be connected to other components on circuit board 112, such as integrated circuits (IC), resistors, capacitors, transistors, switches, and even other circuit boards, connected to additional circuit board contacts (not shown) using the traces in circuit board 112. Circuit board 112 may be a single or multi-layer printed circuit board (PCB). Circuit board 112 may be a rigid or flexible circuit board.

As shown in FIG. 1, a ribbon cable 116 is connected to plug 114 to access the set of traces in circuit board 112. Plug 114 is attached to a set of pins (not shown) on circuit board 112. Through ribbon cable 116, plug connector 100 can connect to another circuit board (not shown) or other components. In another embodiment, the set of traces in circuit board 112 may be accessed through a set of contact surfaces on top of circuit board 112.

Housing 102 may be made of any single type of or composite material such that the material surrounding set of openings 108 is not conductive to electricity. In one embodiment, housing 102 is made of a plastic material, such as Acrylonitrile-Butadiene-Styrene (ABS). In another embodiment, housing 102 may be made out of a clear plastic material. In yet another embodiment, housing 102 may be made out of a combination of plastic and metal materials, where portions of housing 102 may use metal to allow housing 102 to act as a conductor (e.g., for signal or for grounding), or as shielding. Again, the material used surrounding set of openings 108 is preferably not electrically conductive. Similarly, contact support 302 may also be made of the same material as housing 102. In contrast, set of contacts 110 may be constructed using any conductive material. In one embodiment, set of contacts 110 may be constructed using gold. In another embodiment, set of contacts 110 may be constructed using copper. The choice of materials for housing 102, contact support 302, and set of contacts 110 is dependant on the application for the connector system.

Figure 4:
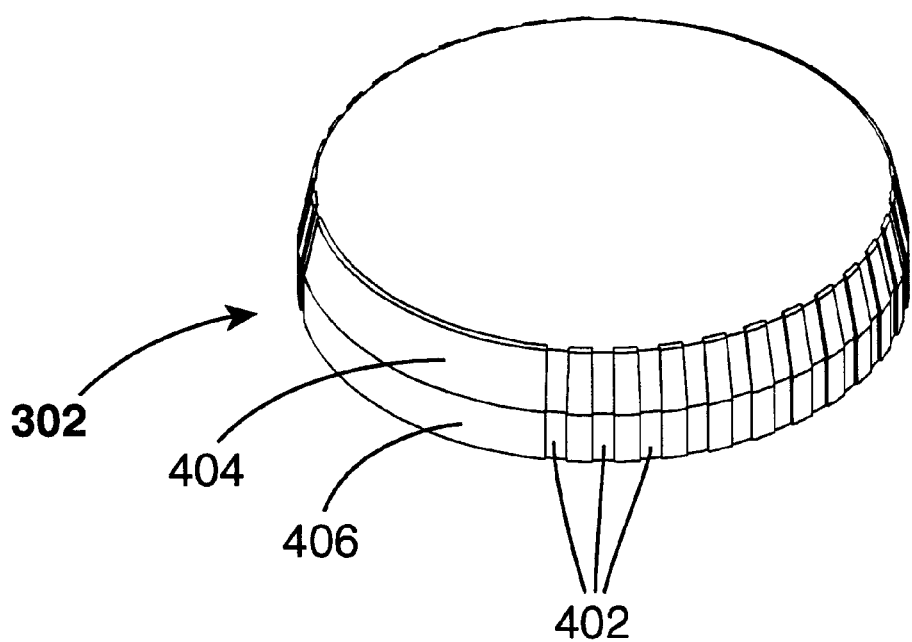
FIG. 4 is an isometric view of a contact support from the plug connector.

FIG. 4 is an isometric view of contact support 302. Contact support 302 is used to support set of contacts 110 and contains a set of slots 402 used to receive set of contacts 110. In one embodiment, contact support 302 includes an upper side section 404 that is shaped to conform to set of contacts 110 for support. Contact support 302 also includes a bottom side section 406 that may conform to support set of contacts 110. In another embodiment, only the portion of upper side section 404 or bottom side section 406 that is useful for supporting set of contacts 110 is shaped to conform to set of contacts 110. Set of contacts 110 may be molded onto contact support 302 before set of contacts 110 are attached to set of circuit board contacts 308 through a process such as a solder reflow process.

FIG. 2 is an isometric view of a receptacle connector 200. Receptacle connector 200 includes a circular housing 202 that has a keying/alignment element 206 and a set of openings 208. A set of contacts 210 protrudes from set of openings 208. In another embodiment, set of openings 208 may include a set of openings located on an outer perimeter 218. In this embodiment, set of contacts 210 includes a set of contacts that are accessible through the set of openings on outer perimeter 218. In yet another embodiment, set of openings 208 are located on outer perimeter 218. Set of contacts 210 is mounted to a circuit board 212 through a set of circuit board contacts 508 on circuit board 212 (not shown). Circuit board 212 is connected to a plug 214 that is on a ribbon cable 216.

Figure 5:
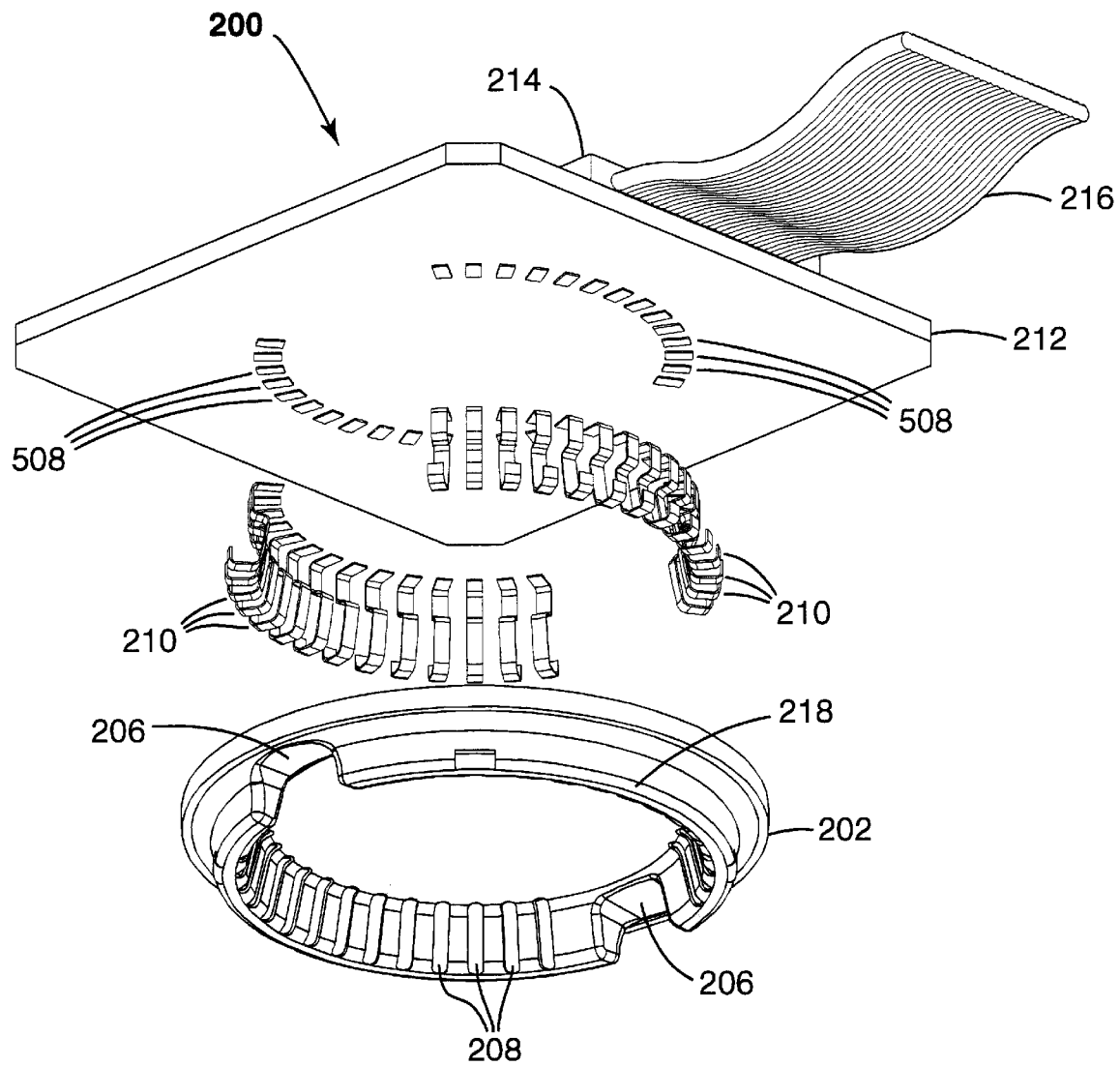
FIG. 5 is an exploded isometric view of the receptacle connector of FIG. 2.

FIG. 5 is an exploded isometric view of receptacle connector 200, where set of contacts 210 and set of circuit board contacts 508 are exposed. Set of circuit board contacts 508 is connected to a set of traces in circuit board 212 (not shown). Plug 214 is also connected to the set of traces. Similar to the set of traces in circuit board 112, the set of traces in circuit board 212 allows the connection of circuit board contacts 508 to plug 214 and other components, such as ICs, resistors, capacitors, transistors, switches, and other circuit boards. In addition, circuit board 212 may be a single or multi-layered PCB as either a rigid or a flexible circuit board.

Figure 6:
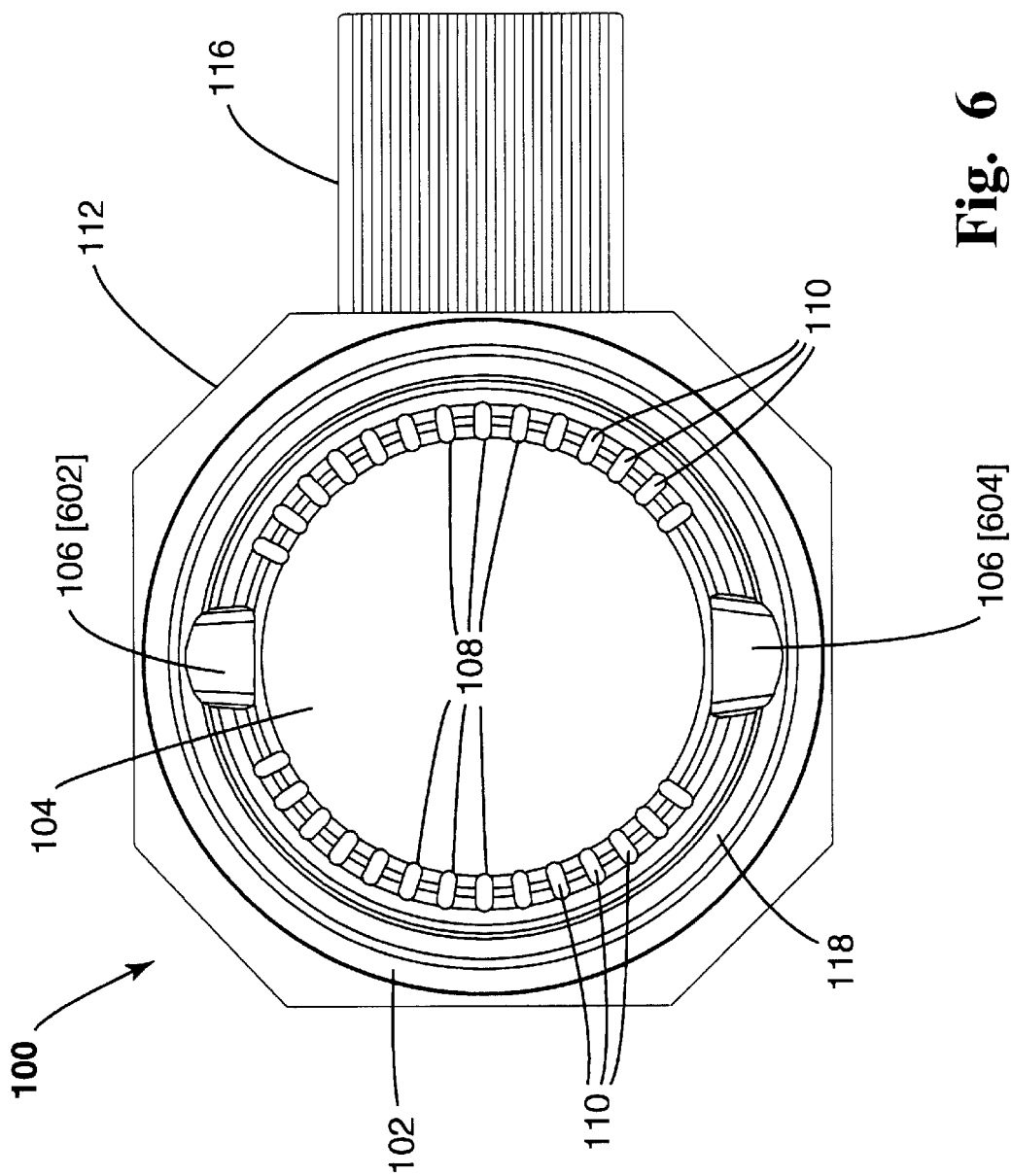
FIG. 6 is a top-down view of the plug connector.
Figure 7:
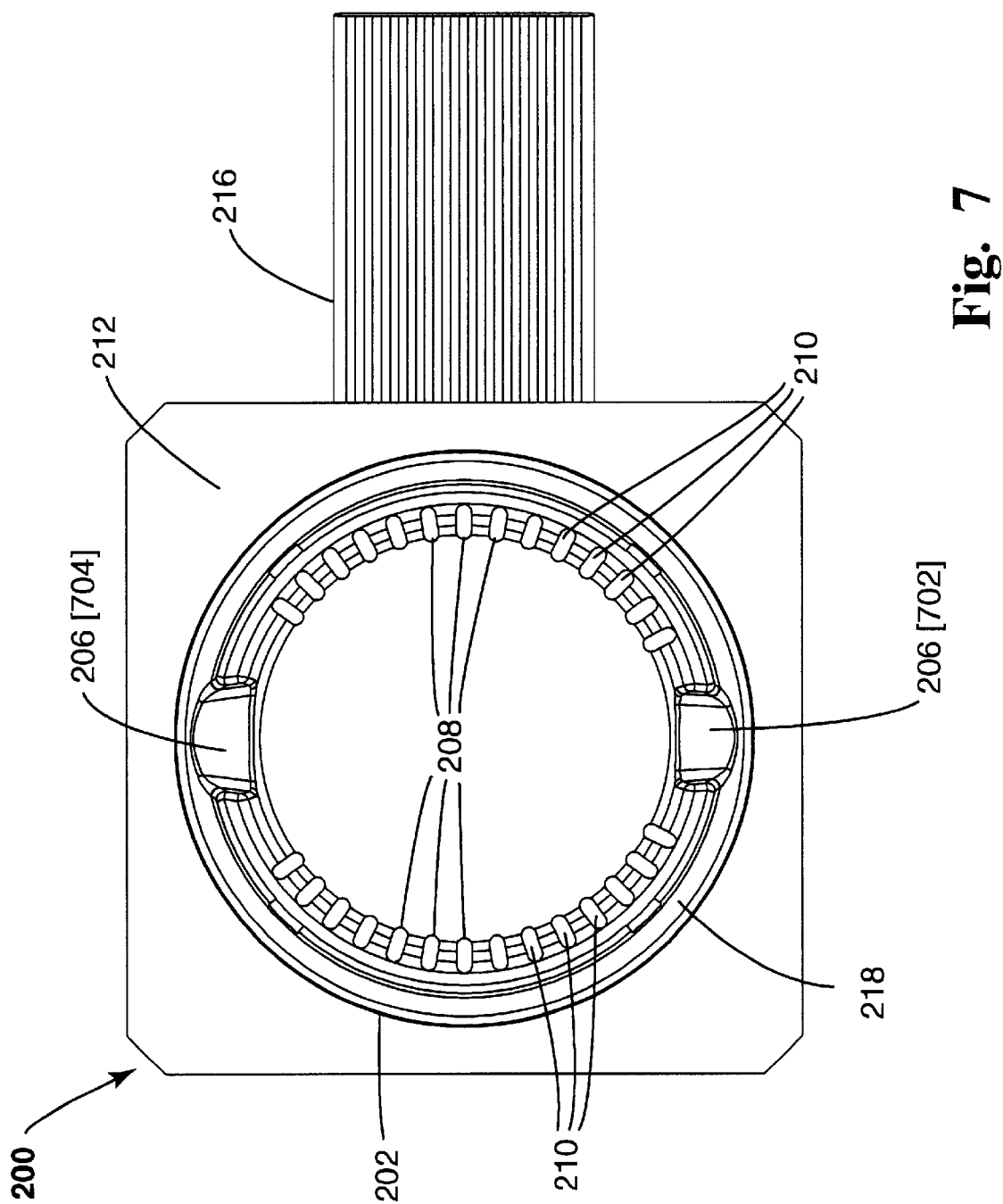
FIG. 7 is a top-down view of the receptacle connector.

FIG. 6 is a top-down view of plug connector 100 where keying/alignment element 106 is further detailed. FIG. 7 is a top-down view of receptacle connector 200 where keying/alignment element 206 is also further detailed. Keying/alignment element 106 includes two different sized keying/alignment elements 602 and 604. Similarly, keying/alignment element 206 also includes two different sized keying/alignment elements 702 and 704. The size and shapes of keying/alignment elements of plug connector 100 are matched to keying/alignment elements of receptacle connector 200. Specifically, the sizes and shapes of keying/alignment elements 602 and 604 are matched to keying/alignment elements 702 and 704, respectively, to reduce the chance of a misalignment in connecting the connectors.

In other embodiments, a different number of keying/alignment elements may be used. This may be as few as a single keying/alignment element. In addition, the keying/alignment elements may be of different shapes and sizes to further reduce the chance of misalignment in connections. The keying/alignment elements may also be located at the center of the connectors. For example, a keying/alignment element may be located on center portion 104 on plug connector 100, with a corresponding keying/alignment element located on a center portion of receptacle connector 200.

Figure 8:
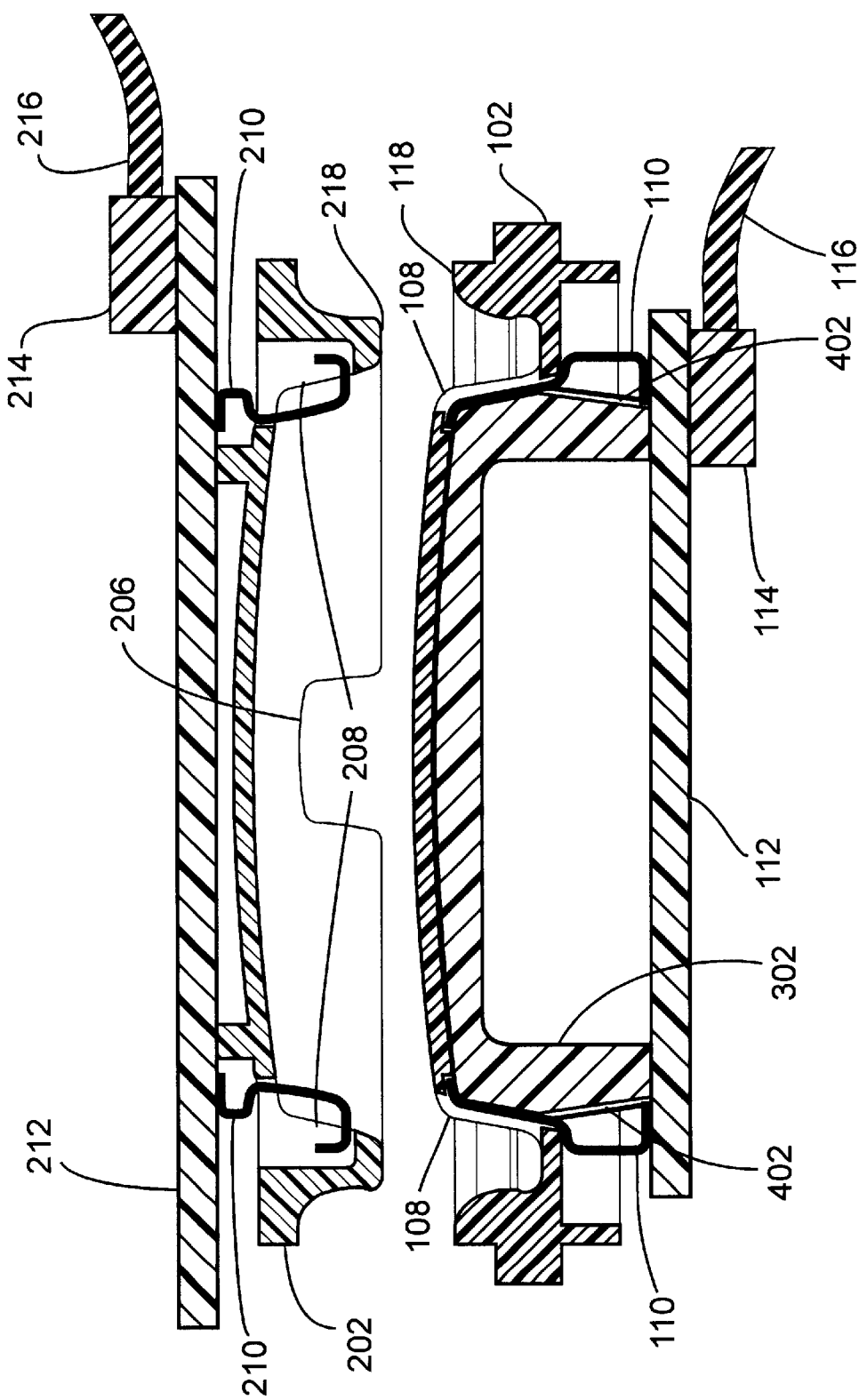
FIG. 8 is a cross-sectional view of the plug connector in proximity to the receptacle connector.

FIG. 8 is a cross-sectional view of plug connector 100 in proximity to receptacle connector 200. Circular housing 202 of receptacle connector 200 contains set of openings 208 through which set of contacts 210 is accessible. In addition, circular housing 102 of plug connector 100 also contains set of openings 108 through which set of contacts 110 is accessible. Set of contacts 110 are supported by contact support 302 such that set of contacts 110 do not substantially move when set of contacts 210 comes into connection with set of contacts 110. Instead, set of contacts 210 is able to deflect. In another embodiment, set of contacts 110 is unsupported and is also able to deflect. In yet another embodiment, set of contacts 210 is supported and does not deflect. Set of contacts 210 has an "S" shape to deflect and to absorb flex.

Figure 9:
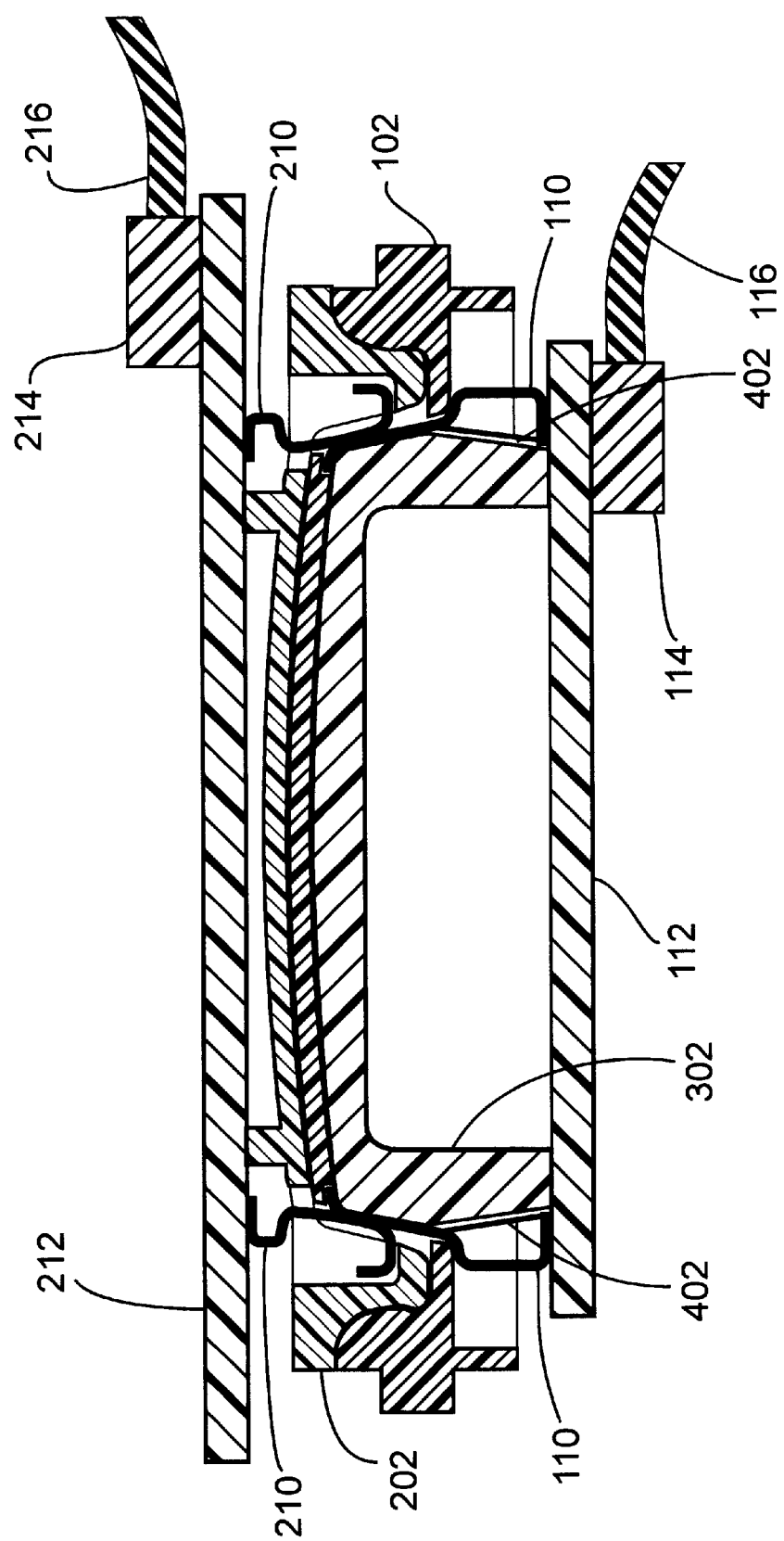
FIG. 9 is a cross-sectional view of the plug connector mated with the receptacle connector.

FIG. 9 is a cross-sectional view of plug connector 100 mated with receptacle connector 200. Set of connectors 210 is in contact with set of connector 110. As can be seen in FIG. 9, set of contacts 210 is deflected as set of contacts 110 is supported by contact support 302.

In implementations where the connector system is used to connect devices in a vertical manner (i.e., where devices are stacked vertically), plug connector 100 is typically used as a top connector and receptacle connector 200 is typically used as a bottom connector. For example, where the connectors are used to couple a top device to a bottom device, plug connector 100 is affixed on the top of the bottom device, while receptacle connector 200 is affixed at the bottom of the top device. In this case, the devices are coupled simply by placing the top device on the bottom device. As discussed above, alignment between the connectors is through keying/alignment elements on the connectors.

Figure 10:
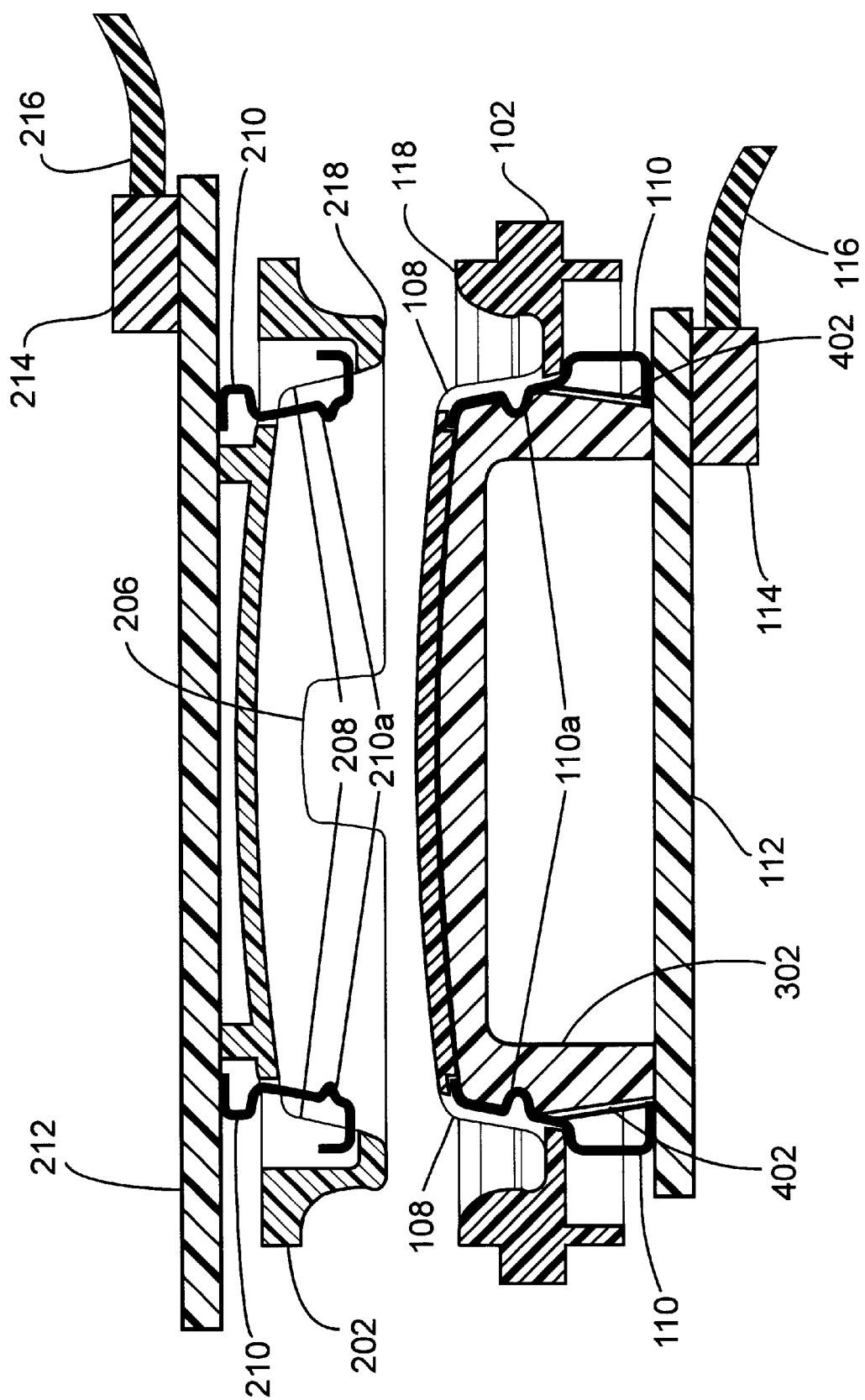
FIG. 10 is a cross-sectional view of an alternate embodiment of the plug connector in proximity to an alternate embodiment of the receptacle connector.

In FIG. 10, an alternate embodiment is illustrated where set of contacts 110 is shaped to mechanically engage and hold set of contacts 210 in addition to providing electrical connections. Set of contacts 110 contains a curved portion mirrored to an oppositely curved portion on set of contacts 210, where set of contacts 110 has an indented portion 110a and set of contacts 210 has a protruded portion 210a matched to substantially fit indented portion 110a. With set of contacts 210 displaced radially around set of contacts 110 during the connection of plug connector 100 to receptacle connector 200, there is enough force in the deflection of set of contacts 210 to couple the two sets of contacts. In addition, the engagement of indented portion 110a in set of contacts 110 to the protruding portion 210a in set of contacts 210 keeps the connectors coupled.

In another embodiment, the contacts in set of contacts 110 have a protruding portion instead of an indented portion. The protruding portion may or may not be supported by contact support 302. Also, depending on the configuration of the connectors, not all contacts need to have an indented or protruding portion. This allows the connectors to be snapped together during connection with less force. Thus, for example, every third contact may have a protruding or indented portion. In addition, contacts in both set of contacts 110 and set of contacts 210 may contain multiple protruding or indented portions.

In another embodiment, a separate latching mechanism (not shown) is used to mechanically hold the two sets of contacts. This latching mechanism may be integrated with the connectors or located separately. For example, two hooks (not shown) may be used on plug connector 100 that are matched to two loops (not shown) on receptacle connector 200, one on each side, to supplement or provide mechanical fastening when the connectors are engaged. Also, a set of detents, matched to a set of protrusions, may be used on the connectors either along with or in place of the latching mechanism created by the protruding and indented portions in the contacts.

In yet another embodiment, plug connector 100 includes a protective sheath (not shown) that retracts when plug connector 100 connects to receptacle connector 200. The sheath protects the connectors on plug connector 100 and may have a mechanical or spring loaded catch for releasing the sheath. Receptacle connector 200 may also have a protective sheath such that either plug connector 100, receptacle connector 200, or both may have protection for the contacts.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An electrical connector comprising:
    a connector housing having a first surface with a center portion, the center portion having a circular periphery; and,
    a set of contacts disposed radially around the center portion of the connector housing and accessible through a set of openings in the first surface of the connector housing, each contact in the set of contacts having an end, the set of contacts configured to couple to a matching set of contacts on an oppositely mated electrical connector to form a mechanically interlocked electrical connection wherein:
    (1) the set of contacts are inset in the set of openings in the first surface, where the set of contacts are prohibited from protruding out of the set of openings, and the end of each contact in the set of contacts are angled inward towards the center portion,
    (2) the mechanically interlocked electrical connection is formed with at least one of the contacts in the set of contacts containing a curved portion that is adapted to substantially mirror an oppositely curved portion on a matching contact in the matching set of contacts in the oppositely mated electrical connector, and,
    (3) when the electrical connector is mated with the oppositely mated electrical connector, the set of contacts together exert a radial mechanical force for engaging the matching set of contacts.

2. The electrical connector of claim 1, where the connector housing further includes:
    a set of alignment elements disposed around the center portion.

3. The electrical connector of claim 1, where the set of contacts is supported by a contact support.

4. The electrical connector of claim 1, where the curved portion is an indented section that is mirrored to an oppositely protruding section on the oppositely curved portion on the matching contact, wherein when the set of contacts are mated to a matching set of contacts on the oppositely mated electrical connector, the indented section and the oppositely protruding section exerting sufficient mechanical force to keep the connectors mated.

5. The electrical connector of claim 1, where the curved portion is an protruding section that is mirrored to an oppositely indented section on the oppositely curved portion on the matching contact, wherein when the set of contacts are mated to a matching set of contacts on the oppositely mated electrical connector, the protruding section and the oppositely indented section exerting sufficient mechanical force to keep the connectors mated.

6. The electrical connector of claim 1, where each contact in the set of contacts has a first end and a second end, and both the first end and the second end are hidden within the set of openings.

7. The electrical connector of claim 6, where an initial coupling between the set of contacts and the matching set of contacts occur between the first end and the second end.

8. The electrical connector of claim 1, wherein the center portion is conical in shape.

9. The electrical connector of claim 2, where the set of alignment elements are visible to assist in alignment of the electrical connector to the oppositely mated electrical connector.

10. An electronic device comprising:
    a set of electrical components;
    an electrical connector located on a first surface of the electronic device and coupled to the set of electrical components, the electrical connector including:
        a connector housing having a first surface with a center portion, the center portion having a circular periphery; and,
        a set of contacts disposed radially around the center portion of the round connector housing and accessible through a set of openings in the first surface of the connector housing, each contact in the set of contacts having an end, the set of contacts configured to couple to a matching set of contacts on an oppositely mated electrical connector to form a mechanically interlocked electrical connection wherein:
        (1) the set of contacts are inset in the set of openings in the first surface, where the set of contacts are prohibited from protruding out of the set of openings, and the end of each contact in the set of contacts are angled inward towards the center portion,
        (2) the mechanically interlocked electrical connection is formed with at least one of the contacts in the set of contacts containing a curved portion that is adapted to substantially mirror an oppositely curved portion on a matching contact in the matching set of contacts in the oppositely mated electrical connector, and,
        (3) when the electrical connector is mated with the oppositely mated electrical connector, the set of contacts together exert a radial mechanical force for engaging the matching set of contacts.

11. The electronic device of claim 10, where the connector housing further includes:
    a set of alignment elements disposed around the center portion.

12. The electronic device of claim 10, where the set of contacts is supported by a contact support.

13. The electronic device of claim 10, where the curved portion is an indented section that is mirrored to an oppositely protruding section on the oppositely curved portion on the matching contact, wherein when the set of contacts are mated to a matching set of contacts on the oppositely mated electrical connector, the indented section and the oppositely protruding section exerting sufficient mechanical force to keep the connectors mated.

14. The electronic device of claim 10, where the curved portion is an protruding section that is mirrored to an oppositely indented section on the matching contact, wherein when the set of contacts are mated to a matching set of contacts on the oppositely mated electrical connector, the protruding section and the oppositely indented section having enough mechanical force to keep the connectors mated.

15. An electrical connector comprising:
    a connector housing having a first surface with a center portion, the center portion having a circular periphery; and, a set of contacts disposed radially around the center portion of the connector housing and accessible through a set of openings in the first surface of the connector housing, the set of contacts configured to couple to a matching set of contacts on an oppositely mated electrical connector to form a mechanically interlocked electrical connection wherein:

(1) each contact in the set of contacts has a first end and a second end, and both the first end and the second end are hidden within the set of openings and one of the first end and the second end is angled inward towards the center portion, (2) the mechanically interlocked electrical connection is formed with at least one of the contacts in the set of contacts containing a curved portion that is adapted to substantially mirror an oppositely curved portion on a matching contact in the matching set of contacts in the oppositely mated electrical connector, and, (3) when the electrical connector is mated with the oppositely mated electrical connector, the set of contacts together exert a radial mechanical force for engaging the matching set of contacts.

* * * * *